US010081740B2

(12) United States Patent
Cheng et al.

(10) Patent No.: US 10,081,740 B2
(45) Date of Patent: Sep. 25, 2018

(54) DIRECTED SELF-ASSEMBLY

(71) Applicant: International Business Machines Corporation, Armonk, NY (US)

(72) Inventors: Joy Cheng, Taipei (TW); Michael A. Guillorn, Yorktown Heights, NY (US); Chi-Chun Liu, Altamont, NY (US); Jed W. Pitera, Portola Valley, CA (US); Hsinyu Tsai, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/728,877

(22) Filed: Oct. 10, 2017

(65) Prior Publication Data

US 2018/0030312 A1    Feb. 1, 2018

Related U.S. Application Data

(62) Division of application No. 14/754,664, filed on Jun. 29, 2015, now Pat. No. 9,884,978.

(51) Int. Cl.
*C09D 201/00* (2006.01)
*H01L 21/027* (2006.01)
*G03F 7/00* (2006.01)

(52) U.S. Cl.
CPC ......... *C09D 201/00* (2013.01); *G03F 7/0002* (2013.01); *H01L 21/0271* (2013.01)

(58) Field of Classification Search
CPC .. C09D 201/00; H01L 21/0271; G03F 7/0002
See application file for complete search history.

(56) References Cited

U.S. PATENT DOCUMENTS 8,894,869 B2    11/2014    Chang et al.

OTHER PUBLICATIONS

Jeong, Seong-Jun et al.; "Directed self-assembly of block copolymers for next generation nanolithography"; Materials Today; vol. 16; No. 12; Dec. 2013; pp. 468-476.
Non Final Office for U.S. Appl. No. 14/754,665 dated Jun. 5, 2017; pp. 16.
Notice of Allowance for U.S. Appl. No. 14/754,664 dated Sep. 27, 2017; pp. 19.

*Primary Examiner* — John P Dulka
(74) *Attorney, Agent, or Firm* — Steven J. Meyers; Hoffman Warnick LLC

(57) ABSTRACT

The disclosure provides methods for directed self-assembly (DSA) of a block co-polymer (BCP). In one embodiment, a method includes: forming an oxide spacer along each of a first sidewall and a second sidewall of a cavity in a semiconductor substrate; forming a neutral layer between the oxide spacers and along a bottom of the cavity; and removing the oxide spacers to expose the first and second sidewalls and a portion of the bottom of the cavity adjacent the first and second sidewalls.

13 Claims, 6 Drawing Sheets

DIRECTED SELF-ASSEMBLY

BACKGROUND

Graphoepitaxy directed self-assembly (DSA) employs a topographical guiding pattern to direct the self-assembly of block copolymers (BCPs). One commonly-used BCP in DSA includes polystyrene (PS) and poly(methyl methacrylate) (PMMA) as the monomeric species, commonly referred to as PS-PMMA. BCPs employing other polymer species are possible, of course, including, for example, polystyrene-polyvinylpyrrolidone (PS-PVP), polystyrene-polydimethylsiloxane (PS-PDMS), polystyrene-polytrimethylsilylstyrene (PS-PTMSS), and polystyrene-polyhydroxystyrene (PS-PHOST).

BCPs may arrange into any number of patterns during self-assembly. Controlling or directing this arrangement enables the formation of patterns useful in semiconductor manufacturing. DSA can therefore be employed in place of multiple steps of patterning and etching during the manufacture of a semiconductor device.

SUMMARY

In one embodiment, the invention provides a method comprising: forming an oxide spacer along each of a first sidewall and a second sidewall of a cavity in a semiconductor substrate; forming a neutral layer between the oxide spacers and along a bottom of the cavity; and removing the oxide spacers to expose the first and second sidewalls and a portion of the bottom of the cavity adjacent the first and second sidewalls.

In another embodiment, the invention provides a method comprising: forming a neutral layer along a first sidewall, a second sidewall, and a bottom of a semiconductor cavity; depositing a polymeric sacrificial material atop the neutral layer; and removing the polymeric sacrificial material and a portion of the neutral layer, whereby a remaining portion of the neutral layer extends along the bottom of the cavity and along at least a portion of each of the first and second sidewalls.

In still another embodiment, the invention provides a method comprising: depositing a neutral polymeric material within a cavity in a semiconductor material; baking the neutral polymeric material; and removing a portion of the neutral polymer material, whereby a remaining portion of the neutral polymeric material forms a neutral layer extending along a bottom of the cavity and along at least a portion of each of a first and a second sidewall of the cavity.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1A:
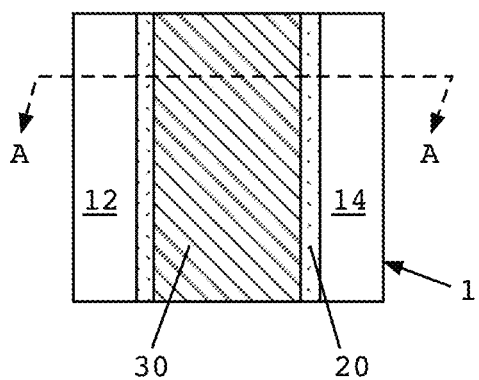
FIGS. 1A and 1B show, respectively, cross-sectional top- and side-views of one arrangement following the directed self assembly (DSA) of a block co-polymer (BCP)

It is noted that the drawings of the invention are not to scale. The drawings are intended to depict only typical aspects of the invention, and therefore should not be considered as limiting the scope of the invention. In the drawings, like numbering typically represents like elements between and among the drawings.

DETAILED DESCRIPTION

Figure 1B:
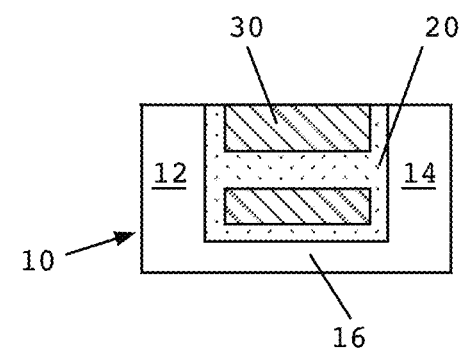

As noted above, during self-assembly, a BCP may arrange into any number of patterns or configurations. For example, FIGS. 1A and 1B show, respectively, top and side cross-sectional views of one such DSA arrangement. FIG. 1B is a cross-sectional view taken along plane A-A of FIG. 1A. A BCP has been deposited into a substrate 10 having a pair of sidewalls 12, 14 and a bottom 16. Substrate 10 may comprise or include any now known or later developed semiconductor material including but not limited to amorphous or crystalline silicon, amorphous carbon, germanium, silicon germanium, silicon carbide, silicon oxide, silicon nitride, an organic planarization layer, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). As will be explained in greater detail below, in some embodiments of the invention, substrate 10 is preferably etch resistant to dilute hydrogen fluoride.

In FIGS. 1A and 1B, PMMA 20 and PS 30 have self-assembled to form vertically-stacked layers of PS within PMMA. This is achieved or directed by the use of sidewalls 12, 14 and bottom 16 to which PMMA is attracted and PS is not. That is, sidewalls 12, 14 and bottom 16 are preferential to PMMA. For example, PMMA is polar and PS is not. In a case such as that shown in FIGS. 1A and 1B, the sidewalls 12, 14 and bottom 16 may be chemically charged to direct alignment of PMMA during self-assembly. In terms of semiconductor manufacture, however, the arrangement shown in FIGS. 1A and 1B is of limited use.

Figure 2A:
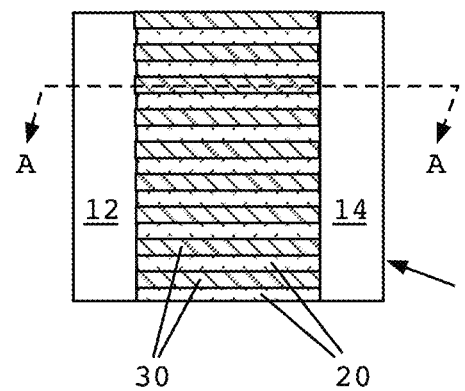
FIGS. 2A and 2B show, respectively, cross-sectional top- and side-views of another arrangement following the DSA of a BCP.
Figure 2B:
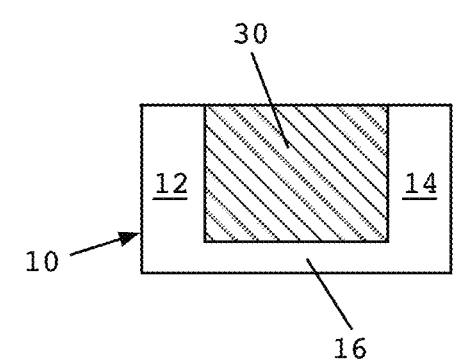

FIGS. 2A and 2B show similar top and side cross-sectional views of another DSA arrangement. Here, sidewalls 12, 14 and bottom 16 are all neutral, such that there is no preference for PMMA or PS with respect to the sidewalls and the BCP will self-assemble along bottom 16 to form alternating columns of PMMA 20 and PS 30 in a lamellar pattern oriented substantially perpendicular to sidewalls 12, 14. As is known in the art, sidewalls 12, 14 and bottom 16 may be made neutral by depositing, for example, a thin layer of a neutralizing material, e.g., a random copolymer of styrene and methyl methacrylate with a hydroxyl functional group at one end of the polymer chain. The hydroxyl group on the polymer chain will be covalently bonded with a hydroxyl group on surfaces of the substrate through condensation reaction. In such a case, only one monolayer of polymers will be anchored to the surface of the substrate. Excess, unreacted polymers can then be rinsed away with solvents.

Figure 3A:
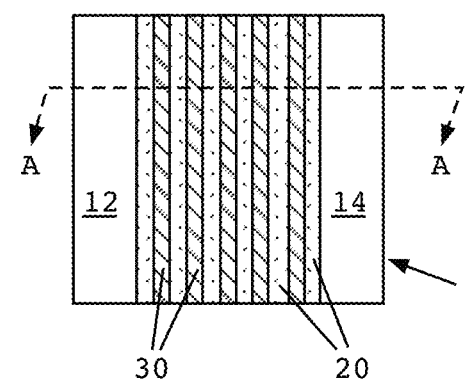
FIGS. 3A and 3B show, respectively, cross-sectional top- and side-views of still another arrangement following the DSA of a BCP.
Figure 3B:
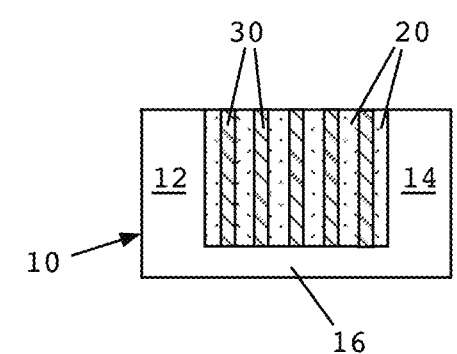

FIGS. 3A and 3B show similar top and side cross-sectional views of yet another DSA arrangement. Here, sidewalls 12, 14 are preferential to PMMA (i.e., PMMA is attracted to sidewalls 12, 14) and bottom 16 is neutral, resulting in a lamellar pattern of alternating columns of PMMA 20 and PS 30 oriented substantially parallel to sidewalls 12, 14. This is the arrangement most typically desired in semiconductor manufacturing.

As noted above, in FIGS. 3A and 3B, preferential sidewalls and a neutral bottom is desired and may be achieved by depositing a polymeric neutral layer on the substrate and performing a lithography process to create photoresist structures on top of the neutral layer. However, resist residues are known to affect the neutrality of such polymeric layers, which in turn can negatively impact the DSA. Photoresist also has lower glass transition temperature than semiconductor materials and therefore limits the annealing temperature for DSA. One could bury the neutral layer underneath semiconductor materials and then use lithography and a reactive ion etch (ME) to reveal the neutral layer while defining the structure. However, plasma etching is also known to damage the neutral layer. These issues can be particularly problematic where double patterning methods are employed, such as Litho Etch Litho Etch (LELE), Litho Freeze Litho Etch (LFLE), and Spacer Image Transfer (SIT), because these methods typically employ plasma etching or result in resist residues.

Figure 4A:
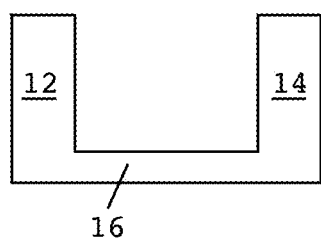
FIGS. 4A through 4E show cross-sectional side-views of the DSA of a BCP according to one embodiment of the invention.

FIGS. 4A through 4E show side cross-sectional views of a DSA method according to one embodiment of the invention. In FIG. 4A, sidewalls 12, 14 and bottom 16 define a cavity in substrate 10. Substrate 10 may be hardened to sustain the temperatures involved in the subsequent BCP annealing process. Such hardening may involve thermal or actinic processes, as is known in the art.

Sidewalls 12 and 14 may be formed in any number of ways, including, for example, etching substrate 10 to form sidewalls 12 and 14, by depositing a material, such as a hard mask, onto substrate 10 to form sidewalls 12, 14, or by depositing a material onto substrate 10 and etching a cavity into the material. Suitable hard masks may include, for example, a nitride, an oxide, an oxynitride, or combinations thereof. Deposition may involve, for example, chemical vapor deposition (CVD) methods, such as plasma enhanced CVD (PECVD), metal-organic CVD (MOCVD), low-pressure CVD (LPCVD), semi-atmosphere CVD (SECVD), high density plasma CVD (HDPCVD), rapid thermal CVD (RTCVD), ultra-high vacuum CVD (UHVCVD), limited reaction processing CVD (LRPCVD), metalorganic CVD (MOCVD). Deposition may also include sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, or evaporation.

Figure 4B:
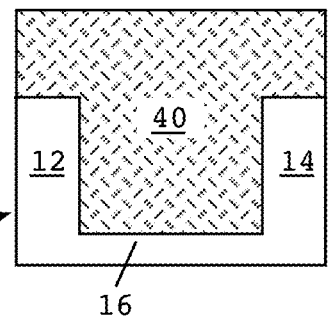

In FIG. 4B, a neutral polymeric material 40, sometimes referred to as a "brush" material, the chemical structure of which is described above, is spun onto substrate 10, entirely lining bottom 16 and the area between sidewalls 12 and 14. Neutral polymeric material 40 is then baked to a proper temperature to activate the reaction between the functional group on the polymers and on the substrate surfaces, including sidewalls 12, 14, and bottom 16. Because there is only one functional group per polymer chain, this reaction will be self-limiting and result in only one monolayer of polymer covalently bonded to substrate 10 while the unreacted polymers are still soluble in solvent.

Figure 4C:
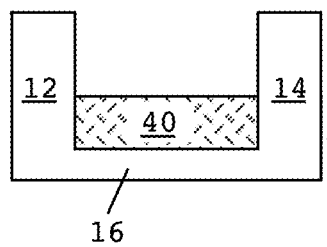
Figure 4D:
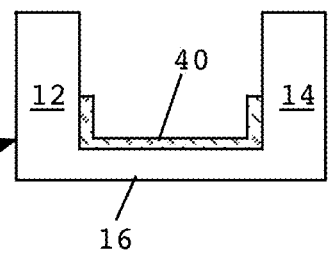

Neutral polymeric material 40 is then etched such that it remains along bottom 16 using, for example, a reactive ion etch, as shown in FIG. 4C. Excess neutral polymeric material 40 may then be removed using a solvent rinse, as shown in FIG. 4D. Solvents and developers usually do not significantly affect the neutrality of neutral polymers, such as neutral polymeric material 40.

The solvents employed to remove excess neutral polymeric material 40 may vary, of course, depending on the polymeric material employed. Suitable solvents include, but are not limited to, propylene glycol monomethyl ether acetate (PGMEA), n-butyl acetate (nBA), toluene, and anisole.

Figure 4E:
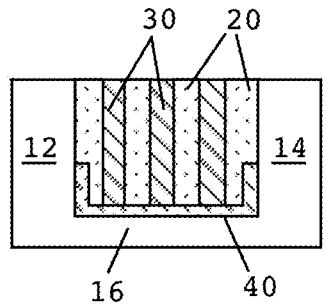

A BCP is then deposited onto the remaining neutral polymeric material 40 and between sidewalls 12 and 14 and annealed, forming a lamellar pattern of alternating columns of PMMA 20 and PS 30 atop the remaining neutral polymeric material 40 and oriented substantially parallel to sidewalls 12, 14, as shown in FIG. 4E.

Figure 5A:
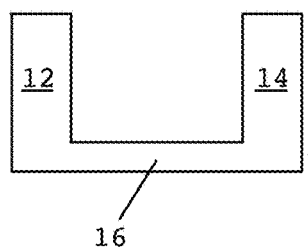
FIGS. 5A through 5G show cross-sectional side-views of the DSA of a BCP according to another embodiment of the invention.
Figure 5B:
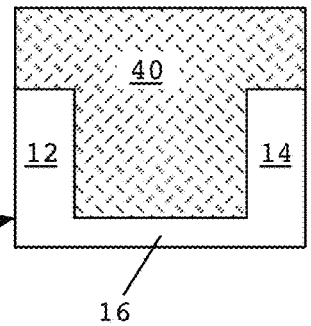

FIGS. 5A through 5G show side cross-sectional views of a DSA method according to another embodiment of the invention. In FIG. 5A, sidewalls 12, 14 and bottom 16 are formed in substrate 10, as described above with respect to FIG. 4A. In FIG. 5B, a neutral polymeric material 40 is spun onto substrate 10, lining bottom 16 and the area between sidewalls 12 and 14. Neutral polymeric material 40 is then baked to activate the reaction between the polymers and substrate 10.

Figure 5C:
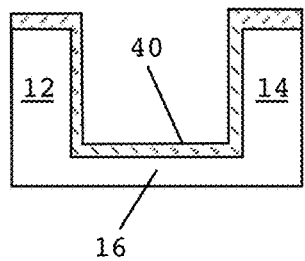

In FIG. 5C, a solvent rinse has been applied, leaving a monolayer of neutral polymeric material 40 covering the top and sides of sidewalls 12, 14 as well as bottom 16. This differs from the structure depicted in FIG. 4C, where an etch leaves neutral polymeric material 40 along just bottom 16.

Figure 5D:
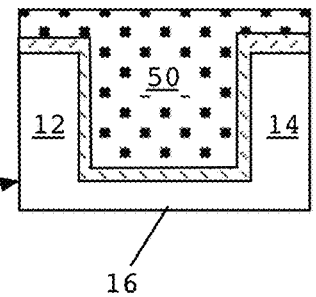
Figure 5E:
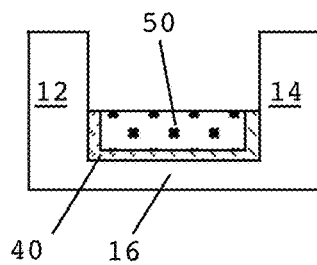

In FIG. 5D, a sacrificial polymeric material, such as photoresist, homopolymer, random or block copolymer, may be deposited atop neutral polymeric material 40. Suitable sacrificial materials include, but are not limited to, ArF photoresist, KrF photoresist, homopolymers of PS, homopolymers of PMMA, and random or block copolymers of PS and PMMA. In FIG. 5E, both sacrificial polymeric material 50 and neutral polymeric material 40 have been etched using, for example, a reactive ion etch. The deposition of sacrificial polymeric material 50 prior to etching allows for greater control of the etching of neutral polymeric material 40 than the direct etching of neutral polymeric material 40 as shown, for example, in FIGS. 4C and 4D.

Figure 5F:
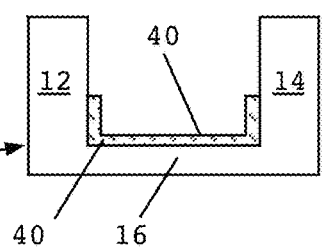
Figure 5G:
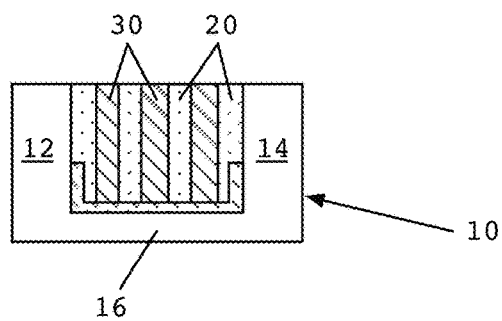

Sacrificial polymeric material 50 may then be removed using, for example, a solvent rinse, to leave neutral polymeric material 40 along bottom 16 and extending partially along sidewalls 12 and 14, as shown in FIG. 5F. A BCP is then deposited onto the remaining neutral polymeric material 40 and between sidewalls 12 and 14 and annealed, forming a lamellar pattern of alternating columns of PMMA 20 and PS 30 atop the remaining neutral polymeric material 40 and oriented substantially parallel to sidewalls 12, 14, as shown in FIG. 5G.

Figure 6:
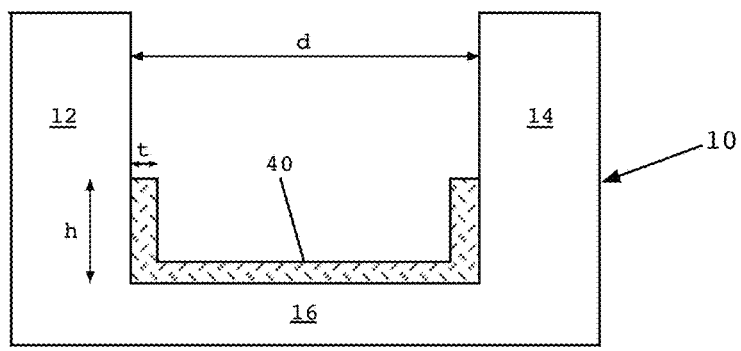
FIG. 6 shows a detailed cross-sectional side-view of a semiconductor substrate prepared for DSA of a BCP according to an embodiment of the invention.

FIG. 6 shows a side cross-sectional view of substrate 10 at the step shown in, for example, FIG. 4D or FIG. 5F. Here, the remaining neutral polymeric material 40 can be seen to have a height h along sidewalls 12 and 14 and a thickness t, both of which may be measured relative to the diameter d of the space between sidewalls 12 and 14. DSA results improve when diameter d is close to multiple of the natural period ($L_O$) of the BCP, which typically ranges from about 3 nm to about 50 nm. Height h and thickness t are dependent upon the material properties of polymeric material 40 and the extent to which neutral polymeric material 40 is removed using, for example, an etch and/or solvent rinse, and preferably optimize subsequent DSA of the BCP.

Figure 7A:
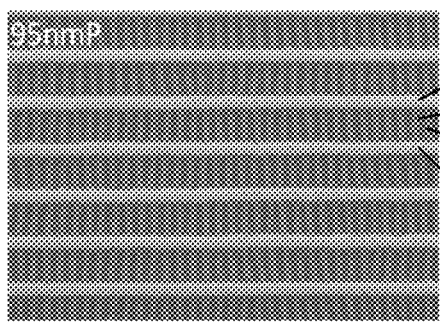
FIGS. 7A through 7D show photomicrographs of the DSA of BCPs according to various embodiments of the invention.

FIGS. 7A through 7D show top-view photomicrographs of DSA results according to embodiments of the invention at varying parameters. In FIG. 7A, for example, DSA has resulted in a lamellar pattern with alternating columns of PMMA 20 and PS 30 oriented substantially perpendicular to sidewalls 12 and 14. This is a consequence of insufficient etching of neutral polymeric material 40, such that sidewalls 12 and 14 remain non-preferential to PS and PMMA.

Figure 7B:
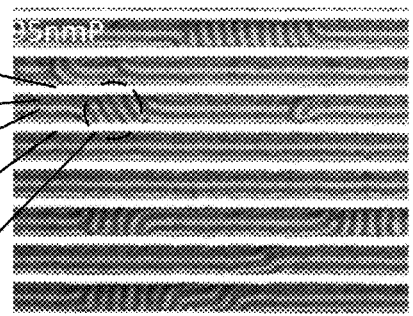

In FIG. 7B, while diameter d and pitch remained the same, etch time was increased, resulting in improved but incomplete orientation of PMMA 20 and PS 30 columns. Defects 25 are still observable and include line breaks and bridging between PMMA 20 and PS 30 columns.

Figure 7C:
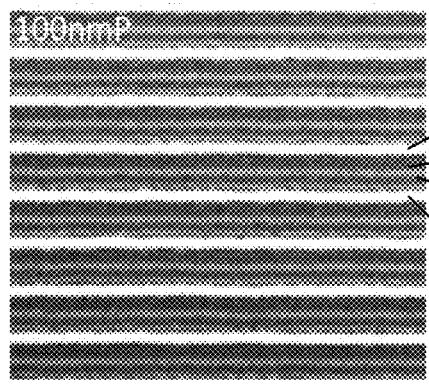

In FIG. 7C, the etch time is the same as that employed in FIG. 7B, but pitch was increased slightly from 95 nm to 100 nm. This has resulted in sidewalls 12, 14 preferential to PMMA and the preferred lamellar pattern of PMMA 20 and PS 30 columns oriented substantially parallel to sidewalls 12 and 14, with no observable DSA defects.

Figure 7D:
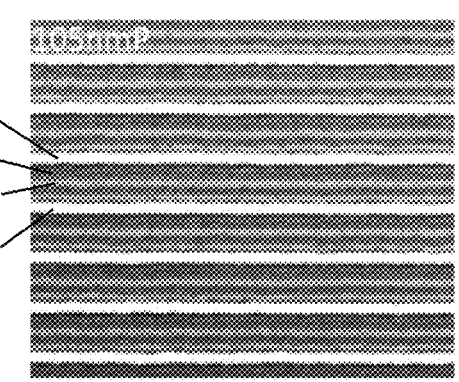

In FIG. 7D, etch time is the same as that employed in FIGS. 7B and 7C, but pitch was again increased slightly to 105 nm. Again, the preferred lamellar pattern of PMMA 20 and PS 30 columns oriented substantially parallel to sidewalls 12 and 14 is obtained, with no observable DSA defects.

Figure 8A:
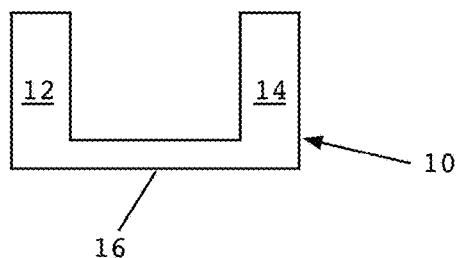
FIGS. 8A though 8H show cross-sectional side-views of the DSA of a BCP according to yet another embodiment of the invention.

FIGS. 8A through 8H show side cross-sectional views of a DSA method according to yet another embodiment of the invention. As in other embodiments, FIG. 8A shows sidewalls 12, 14 and bottom 16 formed in substrate 10. Here, however, sidewalls 12 and 14 as well as bottom 16 need to be resistant to a subsequent etch, such as dilute hydrogen fluoride (dHF), and preferably comprise amorphous carbon, amorphous silicon, silicon nitride (SiN), an organic planarization layer (OPL), or the like. In terms of an OPL, the layer may include any organic self-planarizing polymer. The material of the OPL could be, but is not limited to the organic planarizing materials ODL-102 or ODL-401, which are commercially available from Shin-Etsu Chemical Co., Ltd., or JSRHM8833, which is commercially available from JSR Corporation. The material of the OPL could also be, but is not limited to, a hydrocarbon component of greater than 75% and less than 90% by weight with the remaining components comprising a combination of oxygen with hydrogen, and nitrogen of greater than 5% and less than 20% by weight.

Figure 8B:
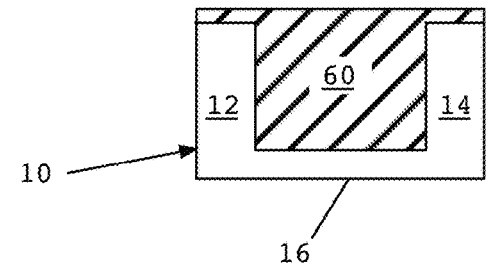
Figure 8C:
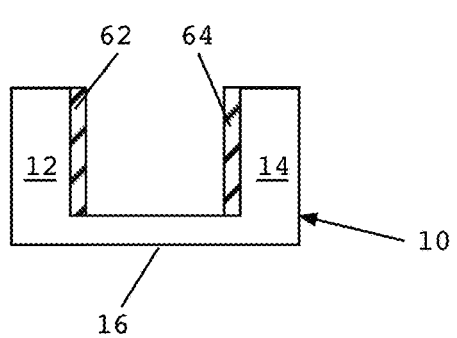
Figure 8D:
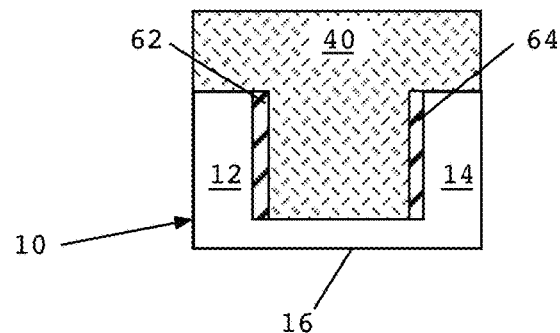

In FIG. 8B, an oxide layer 60 is deposited using, for example, atomic layer deposition (ALD) or a similar process. Oxide layer 60 may comprise, for example, silicon dioxide ($SiO_2$) or hafnium (IV) oxide ($HfO_2$). Oxide layer 60 is then etched to form oxide spacers 62, 64 along sidewalls 12, 14, as shown in FIG. 8C. Oxide layer 60 may be etched using, for example, RIE. Oxide layer 60 may be deposited as a conformal layer.

Figure 8E:
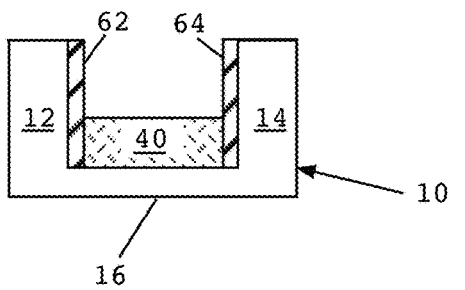

As described above, a neutral polymeric material 40 may be spun onto substrate 10, covering the tops of sidewalls 12, 14, oxide spacers 62, 64, and bottom 16. Neutral polymeric material 40 is then etched, as shown in FIG. 8E.

Figure 8F:
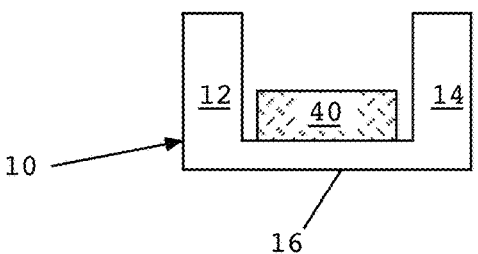
Figure 8G:
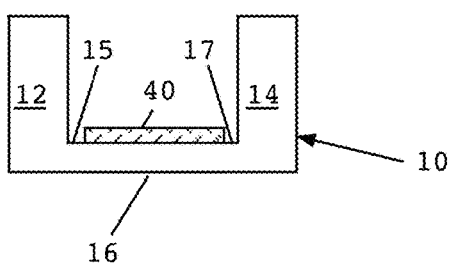

Oxide spacers 62, 64 may then be removed in FIG. 8F using, for example, a dHF etch. A solvent rinse may then be applied as in FIG. 8G to remove excess neutral polymeric material 40. As can be seen, the arrangement of the remaining neutral polymeric material 40 in FIG. 8G differs from that shown in FIGS. 4D and 5F in that neutral polymeric material 40 not only does not extend along a portion of sidewalls 12, 14, but does not extend laterally to sidewalls 12, 14. This leaves portions 15, 17 of bottom 16 adjacent sidewalls 12, 14 uncovered. The polymer extension, h in FIG. 6, varies with process conditions such as etch back time, pattern density, and coating uniformity. As illustrated by FIGS. 7A and 7B, sidewall condition/preference, which correlates to h, is critical to DSA behavior. Hence, the method shown in FIGS. 8A through 8H creates a controllable polymeric material extension independent of process conditions and is advantageous, as compared to the methods shown in FIGS. 4A-4E and 5A-5H under the same parameters.

Figure 8H:
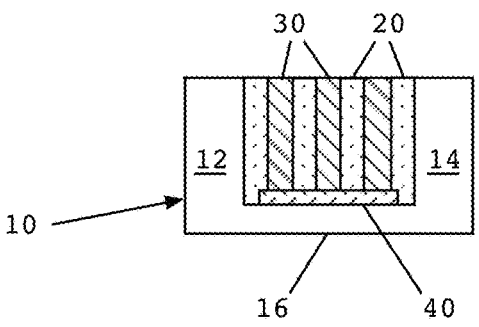

As shown in FIG. 8H, a BCP is then deposited and DSA results in a lamellar pattern of alternating PMMA 20 and PS 30 columns oriented substantially parallel to sidewalls 12, 14.

Figure 9:
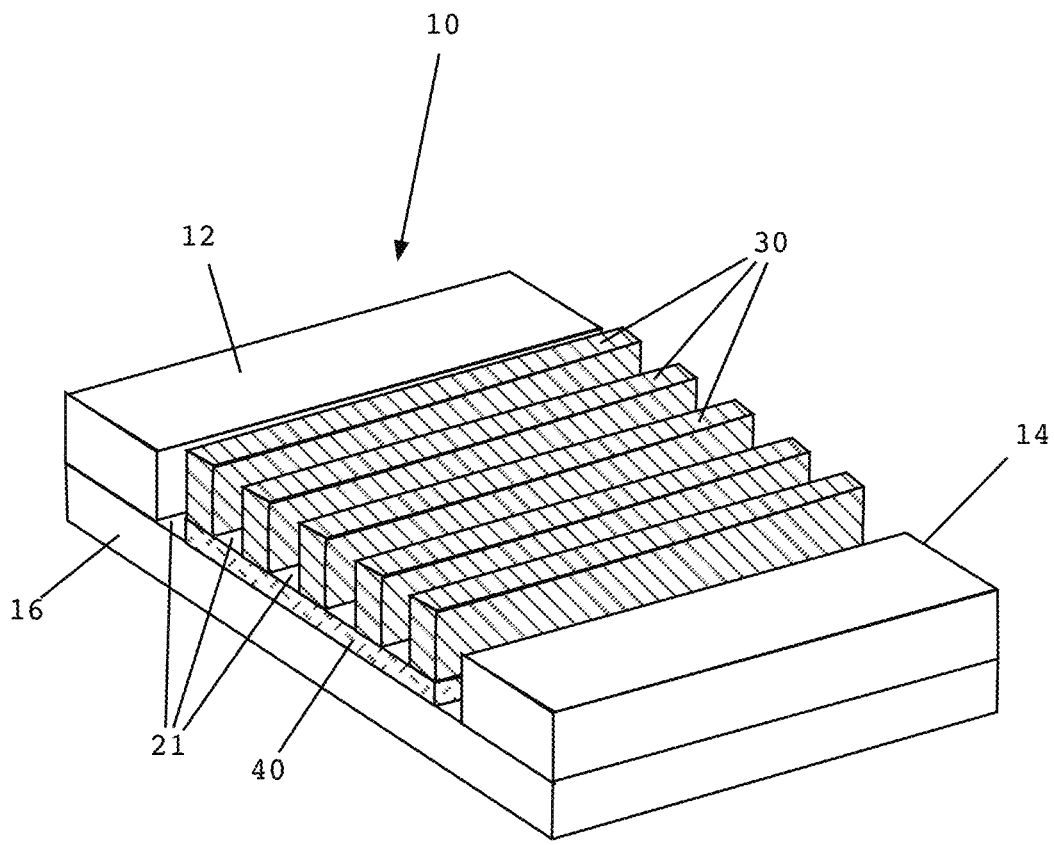
FIG. 9 shows a perspective view of a semiconductor substrate following the DSA of a BCP according to an embodiment of the invention.

FIG. 9 shows a perspective view of substrate 10 following DSA according to various embodiments of the invention. PMMA as well as the neutral layer underneath PMMA may be selectively removed from the lamellar pattern of alternating PMMA and PS columns, leaving voids 21 in place of the PMMA columns. As will be understood by one of skill in the art, PS columns 30 may be employed, among other things, as an etch mask to etch bottom 16 of substrate 10, after which PS columns 30 and neutral polymeric material 40 may be removed.

The descriptions of the various embodiments of the present invention have been presented for purposes of illustration, but are not intended to be exhaustive or limited to the embodiments disclose. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    forming an oxide spacer along each of a first sidewall and a second sidewall of a cavity in a semiconductor substrate;
    forming a neutral layer between the oxide spacers and along a bottom of the cavity; and
    removing the oxide spacers to expose the first and second sidewalls and a portion of the bottom of the cavity adjacent the first and second sidewalls.

2. The method of claim 1, wherein the forming of the oxide spacer includes:
    depositing an oxide into the cavity; and
    removing a portion of the oxide to form a first oxide spacer along the first sidewall and a second oxide spacer along the second sidewall.

3. The method of claim 1, wherein the oxide spacer includes at least one material selected from a group consisting of: silicon dioxide ($SiO_2$), hafnium (IV) oxide ($HfO_2$).

4. The method of claim 1, wherein the forming of the neutral layer includes:
depositing a neutral polymeric material within the cavity;
baking the neutral polymeric material to activate a reaction with substrate; and
removing a portion of the deposited neutral polymeric material between the oxide spacers.

5. The method of claim 1, wherein the neutral polymeric material includes a random copolymer of a polar monomer and a non-polar monomer including one functional group that can bond with the substrate.

6. The method of claim 1, wherein the semiconductor substrate includes at least one material selected from a group consisting of: amorphous carbon, amorphous silicon, silicon nitride (SiN), and an organic planarization layer (OPL).

7. The method of claim 1, further comprising:
depositing a block co-polymer (BCP) into the cavity after removing the oxide spacers; and
annealing the BCP.

8. The method of claim 7, wherein the BCP is selected from a group of BCPs consisting of: polystyrene-poly(methyl methacrylate) (PS-PMMA), polystyrene-polyvinylpyrrolidone (PS-PVP), polystyrene-polydimethylsiloxane (PS-PDMS), polystyrene-polytrimethylsilylstyrene (PS-PTMSS), and polystyrene-polyhydroxystyrene (PS-PHOST).

9. The method of claim 8, wherein the BCP is PS-PMMA and the first and second sidewalls are preferential to PMMA.

10. The method of claim 9, wherein the annealing of the BCP forms a lamellar pattern of alternating columns of PMMA and PS, with a first PMMA column forming adjacent the first sidewall and a second PMMA column forming adjacent the second sidewall and at least one PS column forming between the first and second PMMA columns.

11. The method of claim 10, further comprising:
selectively removing the PMMA columns and the neutral material underneath to expose the first and second sidewalls and at least a portion of the bottom of the cavity.

12. A method comprising:
depositing a neutral polymeric material within a cavity in a semiconductor material;
baking the neutral polymeric material; and
removing a portion of the neutral polymer material,
whereby a remaining portion of the neutral polymeric material forms a neutral layer extending along a bottom of the cavity and along at least a portion of each of a first and a second sidewall of the cavity.

13. The method of claim 12, further comprising:
depositing a polystyrene-poly(methyl methacrylate) (PS-PMMA) block co-polymer (BCP) into the cavity after removing the portion of the neutral polymeric material; and
annealing the BCP to form a lamellar pattern of alternating columns of PMMA and PS, with a first PMMA column forming adjacent the first sidewall and a second PMMA column forming adjacent the second sidewall and at least one PS column forming between the first and second PMMA columns.

* * * * *